(12) United States Patent
Huang

(10) Patent No.: US 10,685,616 B2
(45) Date of Patent: Jun. 16, 2020

(54) SHIFT REGISTER CIRCUIT, METHOD FOR DRIVING THE SAME, GATE DRIVE CIRCUIT, AND DISPLAY PANEL

(71) Applicants: BOE Technology Group Co., Ltd., Beijing (CN); Chengdu BOE Optoelectronics Technology Co., Ltd., Sichuan (CN)

(72) Inventor: Weiyun Huang, Beijing (CN)

(73) Assignees: BOE Technology Group Co., Ltd., Beijing (CN); Chengdu BOE Optoelectronics Technology Co., Ltd., Chengdu, Sichuan (CN)

( * ) Notice: Subject to any disclaimer, the term of this patent is extended or adjusted under 35 U.S.C. 154(b) by 0 days.

(21) Appl. No.: 16/304,978

(22) PCT Filed: Mar. 7, 2018

(86) PCT No.: PCT/CN2018/078332
§ 371 (c)(1),
(2) Date: Nov. 27, 2018

(87) PCT Pub. No.: WO2018/214613
PCT Pub. Date: Nov. 29, 2018

(65) Prior Publication Data
US 2020/0020291 A1    Jan. 16, 2020

(30) Foreign Application Priority Data
May 26, 2017  (CN) .......................... 2017 1 0385081

(51) Int. Cl.
*G09G 3/3266* (2016.01)
*G09G 3/36* (2006.01)
*G11C 19/28* (2006.01)

(52) U.S. Cl.
CPC ......... *G09G 3/3677* (2013.01); *G09G 3/3266* (2013.01); *G11C 19/28* (2013.01); *G09G 2310/0286* (2013.01); *G09G 2310/08* (2013.01)

(58) Field of Classification Search
CPC .............. G09G 3/3677; G09G 3/3266; G09G 2310/0286; G09G 2310/08; G11C 19/28
See application file for complete search history.

(56) References Cited

U.S. PATENT DOCUMENTS

2005/0201508 A1   9/2005  Shin
2010/0177023 A1*  7/2010  Han .................... G11C 19/184
                                                      345/76
2017/0330633 A1* 11/2017  Sun ......................... G09G 1/02

FOREIGN PATENT DOCUMENTS

CN       104299652 A     1/2015
CN       104318904 A     2/2015
(Continued)

OTHER PUBLICATIONS

PCT International Search Report for PCT Patent Application No. PCT/CN2018/078332 dated May 30,2018. 10 Pages.

*Primary Examiner* — Towfiq Elahi
(74) *Attorney, Agent, or Firm* — Arent Fox LLP; Michael Fainberg

(57) ABSTRACT

The disclosure discloses a shift register circuit, a method for driving the same, a gate drive circuit, and a display panel, and the shift register circuit includes: an input circuit, a first control circuit, a second control circuit, a third control circuit, a first output circuit, and a second output circuit, where the input circuit, the first control circuit, the second control circuit, the third control circuit, the first output circuit, and the second output circuit can cooperate with each other, thus shortening a period of time for pulling down the drive signal output terminal, improving a drive capabil- (Continued)

ity of the shift register circuit, and lowering power consumption of the shift register circuit.

17 Claims, 11 Drawing Sheets

(56) References Cited

FOREIGN PATENT DOCUMENTS

| | | |
|---|---|---|
| CN | 104900268 A | 9/2015 |
| CN | 107039014 A | 8/2017 |

* cited by examiner

In the first stage, the input circuit provides the first node with the signal of the input signal terminal, and the second node with the signal of the first reference signal terminal under the control of the first clock signal terminal respectively; the first control circuit connects the first node with the third node under the control of the first reference signal terminal; the second control circuit provides the second node with the signal of the first clock signal terminal under the control of the signal of the third node; the first output circuit provides the drive signal output terminal with the signal of the second clock signal terminal under the control of the signal of the third node; and the second output circuit provides the drive signal output terminal with the signal of the second reference signal terminal under the control of the signal of the second node — S901

In the second stage, the first output circuit provides the drive signal output terminal with the signal of the second clock signal terminal under the control of the signal of the third node, and a stable difference in voltage between the third node and the drive signal output terminal is maintained while the first node is in a floating state; the second control circuit provides the second node with the signal of the first clock signal terminal under the control of the signal of the third node; and the first control circuit disconnects the first node from the third node while the first node is in the floating state — S902

In the third stage, the input circuit provides the first node with the signal of the input signal terminal, and the second node with the signal of the first reference signal terminal respectively under the control of the first clock signal terminal; the first control circuit connects the first node with the third node under the control of the first reference signal terminal; and the second output circuit provides the drive signal output terminal with the signal of the second reference signal terminal under the control of the signal of the second node — S903

In the fourth stage, the second output circuit provides the drive signal output terminal with the signal of the second reference signal terminal under the control of the signal of the second node, and a stable difference in voltage between the second node and the drive signal output terminal is maintained while the second node is in a floating state; the third control circuit provides the first node with the signal of the second reference signal terminal under the control of both the signals of the second clock signal and the second node; and the first control circuit connects the first node with the third node under the control of the first reference signal terminal — S904

Fig. 9

SHIFT REGISTER CIRCUIT, METHOD FOR DRIVING THE SAME, GATE DRIVE CIRCUIT, AND DISPLAY PANEL

CROSS-REFERENCE TO RELATED APPLICATION

This application is a National Stage of International Application No. PCT/CN2018/078332, filed Mar. 7, 2018, which claims the benefit of Chinese Patent Application No. 201710385081.5, filed with the Chinese Patent Office on May 26, 2017, and entitled "A shift register circuit, a method for driving the same, a gate drive circuit, and a display panel", both of which are hereby incorporated by reference in their entireties.

TECHNICAL FIELD

This disclosure relates to the field of display technologies, and particularly to a shift register circuit, a method for driving the same, a gate drive circuit, and a display panel.

BACKGROUND

As the display technologies are developing rapidly, display panels are tending to evolve into highly integrated and cheap display panels, and particularly with the Gate Driver on Array (GPA) technology, a gate switch circuit of a Thin Film Transistor (TFT) is integrated on an array substrate of a display panel to scan and drive the display panel so as to dispense with a wiring space for a bonding area and a fan-out area of a gate integrated Circuit (IC), so that the cost of the product can be lowered in terms of a material cost and a fabrication process thereof, but also the display panel can be fabricated in a visually pleasing design with two symmetric sides and a narrow bezel thereof.

The GOA circuit in the related art may suffer from a low signal drive capability and high power consumption.

SUMMARY

In view of this, the embodiments of the disclosure provide a shift register circuit including: an input circuit, a first control circuit, a second control circuit, a third control circuit, a first output circuit, and a second output circuit, wherein: the input circuit is connected respectively with an input signal terminal, a first clock signal terminal, a first reference signal terminal, a first node, and a second node, and configured to provide the first node with a signal of the input signal terminal, and the second node with a signal of the first reference signal terminal respectively under the control of the first clock signal terminal; the first control circuit is connected respectively with the first reference signal terminal, the first node, and a third node, and configured to connect the first node with the third node under the control of the first reference signal terminal, and to disconnect the first node from the third node while the first node is in a floating state; the second control circuit is connected respectively with the first clock signal terminal, the second node, and the third node, and configured to provide the second node with a signal of the first clock signal terminal under the control of a signal of the third node; the third control circuit is connected respectively with a second clock signal terminal, a second reference signal terminal, the first node, and the second node, and configured to provide the first node with a signal of the second reference signal terminal under the control of both signals of the second clock signal terminal and the second node; the first output circuit is connected respectively with the second clock signal terminal, the third node, and a drive signal output terminal, and configured to provide the drive signal output terminal with a signal of the second clock signal terminal under the control of the signal of the third node, and to maintain a stable difference in voltage between the third node and the drive signal output terminal while the first node A is in the floating state; and the second output circuit is connected respectively with the second reference signal terminal, the second node, and the drive signal output terminal, and configured to provide the drive signal output terminal with the signal of the second reference signal terminal under the control of a signal of the second node, and to maintain a stable difference in voltage between the second node and the drive signal output terminal while the second node is in a floating state.

Optionally in the shift register circuit above according to the embodiments of the disclosure, the second control circuit includes a first switch transistor, wherein a control electrode of the first switch transistor is connected with the third node, a first electrode of the first switch transistor is connected with the first clock signal terminal, and a second electrode of the first switch transistor is connected with the second node.

Optionally in the shift register circuit above according to the embodiments of the disclosure, the input circuit includes a second switch transistor and a third switch transistor, wherein a control electrode of the second switch transistor is connected with the first clock signal terminal, a first electrode of the second switch transistor is connected with the input signal terminal, and a second electrode of the second switch transistor is connected with the first node; and a control electrode of the third switch transistor is connected with the first clock signal terminal, a first electrode of the third switch transistor is connected with the first reference signal terminal, and a second electrode of the third switch transistor is connected with the second node.

Optionally in the shift register circuit above according to the embodiments of the disclosure, the first control circuit includes a fourth switch transistor, wherein a control electrode of the fourth switch transistor is connected with the first reference signal terminal, a first electrode of the fourth switch transistor is connected with the third node, and a second electrode of the fourth switch transistor is connected with the first node.

Optionally in the shift register circuit above according to the embodiments of the disclosure, the third control circuit includes a fifth switch transistor and a sixth switch transistor, wherein a control electrode of the fifth switch transistor is connected with the second node, a first electrode of the fifth switch transistor is connected with the second reference signal terminal, and a second electrode of the fifth switch transistor is connected with a first electrode of the sixth switch transistor; and a control electrode of the sixth switch transistor is connected with the second clock signal terminal, and a second electrode of the sixth switch transistor is connected with the first node.

Optionally in the shift register circuit above according to the embodiments of the disclosure, the first output circuit includes a seventh switch transistor and a first capacitor, wherein a control electrode of the seventh switch transistor is connected with the third node, a first electrode of the seventh switch transistor is connected with the second clock signal terminal, and a second electrode of the seventh switch transistor is connected with the drive signal output terminal; and a first terminal of the first capacitor is connected with the third node, and a second terminal of the first capacitor is connected with the drive signal output terminal.

Optionally in the shift register circuit above according to the embodiments of the disclosure, the second output circuit includes an eighth switch transistor and a second capacitor, wherein a control electrode of the eighth switch transistor is connected with the second node, a first electrode of the eighth switch transistor is connected with the second reference signal terminal, and a second electrode of the eighth switch transistor is connected with the drive signal output terminal; and a first terminal of the second capacitor is connected with the second node, and a second terminal of the second capacitor is connected with the second reference signal terminal.

In another aspect, the embodiments of the disclosure further provide a gate drive circuit including: a plurality of cascaded shift register circuits according to any one of the embodiments above of the disclosure, wherein an input signal terminal of a shift register circuit in a first level is connected with a frame trigger signal terminal; and input signal terminals of respective shift register circuits in other levels than the shift register circuit in the first level are connected respectively with drive signal output terminals of shift register circuits in preceding levels connected therewith.

In still another aspect, the embodiments of the disclosure further provide a display panel including the gate drive circuit above according to the embodiments of the disclosure.

In yet another aspect, the embodiments of the disclosure further provide a method for driving the shift register circuit according to any one of the embodiments above of the disclosure, the method including a first stage, a second stage, a third stage, and a fourth stage, wherein: in the first stage, the input circuit provides the first node with the signal of the input signal terminal, and the second node with the signal of the first reference signal terminal under the control of the first clock signal terminal respectively; the first control circuit connects the first node with the third node under the control of the first reference signal terminal; the second control circuit provides the second node with the signal of the first clock signal terminal under the control of the signal of the third node; the first output circuit provides the drive signal output terminal with the signal of the second clock signal terminal under the control of the signal of the third node; and the second output circuit provides the drive signal output terminal with the signal of the second reference signal terminal under the control of the signal of the second node. In the second stage, the first output circuit provides the drive signal output terminal with the signal of the second clock signal terminal under the control of the signal of the third node, and a stable difference in voltage between the third node and the drive signal output terminal is maintained while the first node is in a floating state; the second control circuit provides the second node with the signal of the first clock signal terminal under the control of the signal of the third node; and the first control circuit disconnects the first node from the third node while the first node is in the floating state. In the third stage, the input circuit provides the first node with the signal of the input signal terminal, and the second node with the signal of the first reference signal terminal respectively under the control of the first clock signal terminal; the first control circuit connects the first node with the third node under the control of the first reference signal terminal; and the second output circuit provides the drive signal output terminal with the signal of the second reference signal terminal under the control of the signal of the second node. And in the fourth stage, the second output circuit provides the drive signal output terminal with the signal of the second reference signal terminal under the control of the signal of the second node, and a stable difference in voltage between the second node and the drive signal output terminal is maintained while the second node is in a floating state; the third control circuit provides the first node with the signal of the second reference signal terminal under the control of both the signals of the second clock signal and the second node; and the first control circuit connects the first node with the third node under the control of the first reference signal terminal.

In another aspect, the embodiments of the disclosure further provide a shift register circuit including a first switch transistor, a second switch transistor, a third switch transistor, a fourth switch transistor, a fifth switch transistor, a sixth switch transistor, a seventh switch transistor, a first capacitor, an eighth switch transistor, and a second capacitor, wherein: a control electrode of the first switch transistor is connected with a third node, a first electrode of the first switch transistor is connected with a first clock signal terminal, and a second electrode of the first switch transistor is connected With a second node; a control electrode of the second switch transistor is connected with the first clock signal terminal, a first electrode of the second switch transistor is connected with an input signal terminal, and a second electrode of the second switch transistor is connected with a first node; a control electrode of the third switch transistor is connected with the first clock signal terminal, a first electrode of the third switch transistor is connected with a first reference signal terminal, and a second electrode of the third switch transistor is connected with the second node; a control electrode of the fourth switch transistor is connected with the first reference signal terminal, a first electrode of the fourth switch transistor is connected with the third node, and a second electrode of the fourth switch transistor is connected with the first node; a control electrode of the fifth switch transistor is connected with the second node, a first electrode of the fifth switch transistor is connected with a second reference signal terminal, and a second electrode of the fifth switch transistor is connected with a first electrode of the sixth switch transistor; a control electrode of the sixth switch transistor is connected with a second clock signal terminal, and a second electrode of the sixth switch transistor is connected with the first node; a control electrode of the seventh switch transistor is connected with the third node, a first electrode of the seventh switch transistor is connected with the second clock signal terminal, and a second electrode of the seventh switch transistor is connected with a drive signal output terminal; a first terminal of the first capacitor is connected with the third node, and a second terminal of the first capacitor is connected with the drive signal output terminal; a control electrode of the eighth switch transistor is connected with the second node, a first electrode of the eighth switch transistor is connected with the second reference signal terminal, and a second electrode of the eighth switch transistor is connected with the drive signal output terminal; and a first terminal of the second capacitor is connected with the second node, and a second terminal of the second capacitor is connected With the second reference signal terminal.

BRIEF DESCRIPTION OF THE DRAWINGS

FIG. 9 is a flow chart of a drive method according to the embodiments of the disclosure.

DETAILED DESCRIPTION OF THE EMBODIMENTS

Figure 1:
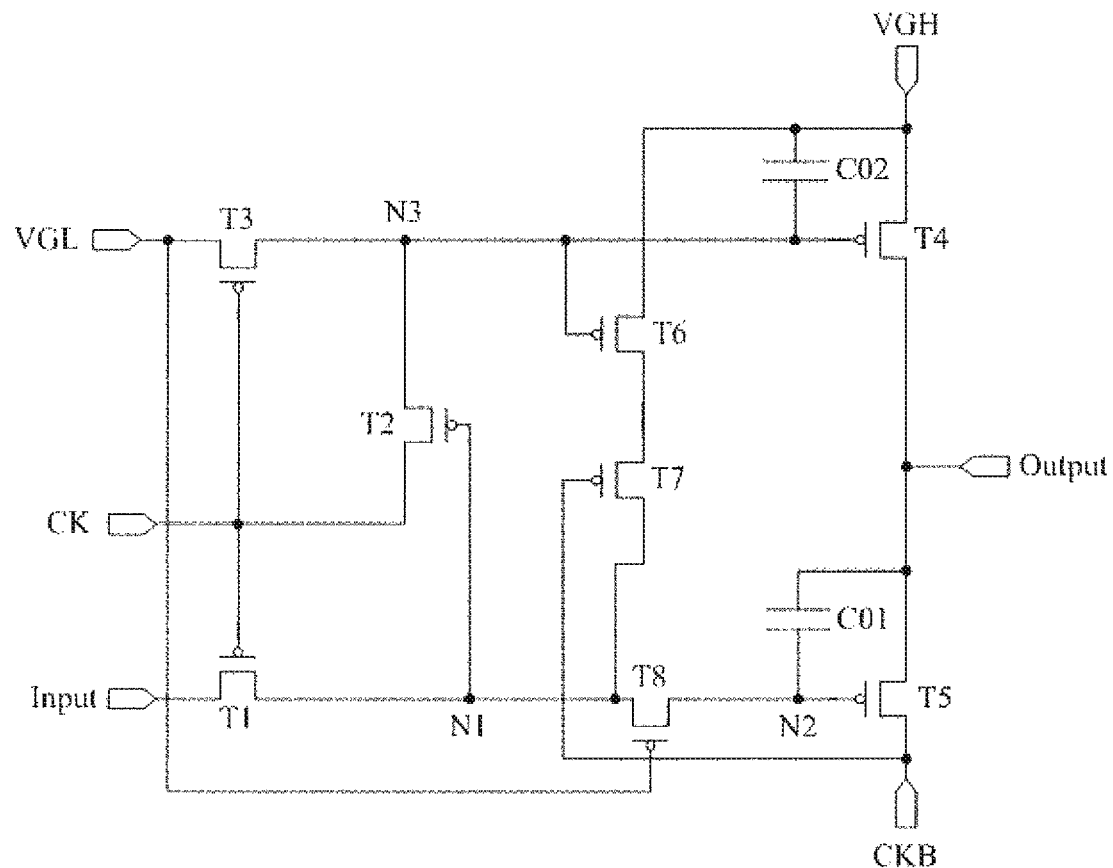
FIG. 1 is a schematic structural diagram of a shift register circuit in the related art.
Figure 2:
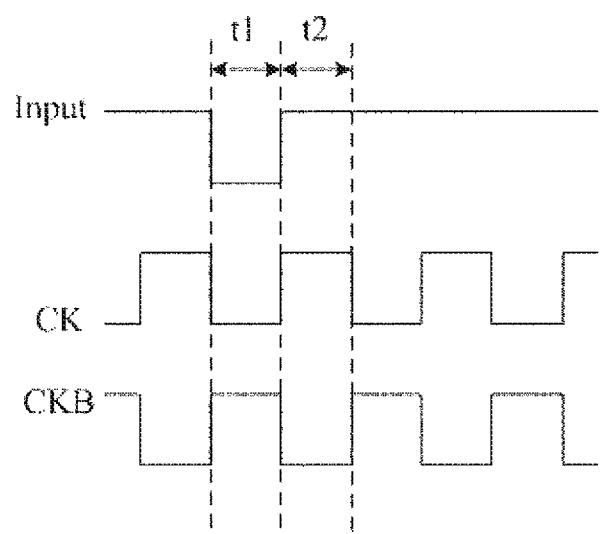
FIG. 2 is an input-output time sequence diagram of the shift register circuit in the related art as illustrated in FIG. 1.

The GOA circuit in the related art typically includes a plurality of cascaded shift register circuits, and drive signal output terminals of respective shift register circuits correspond respectively to gate lines in a one-to-one manner to input scan signals to respective gate lines sequentially. As illustrated in FIG. 1, each shift register circuit in the related art generally includes: a first transistor T1, a second transistor 12, a third transistor T3, a fourth transistor T4, a fifth transistor T5, a sixth transistor T6, a seventh transistor T7, an eighth transistor T8, a capacitor C01 and a capacitor C02. FIG. 2 illustrates a corresponding time sequence diagram thereof, and in an input time period t1, a clock signal CK is at a low level, so both the first transistor T1 and the third transistor T3 are turned on. Since a signal VGL, is at a low level, the eighth transistor T8 is turned on, so both a node N1 and a node N2 are at a low level, and both the second transistor T2 and the fifth transistor T5 are turned on. The second transistor T2 is turned on so that a node N3 is at a low level to control the fourth transistor T4, so a drive signal output terminal Output outputs a drive signal at a high level. The fifth transistor T5 is turned on so that the drive signal output terminal Output also outputs a drive signal at a high level, and the capacitor C1 is charged. In an output time period t2, since the clock signal CK is at a high level, both the first transistor T1 and the third transistor T3 are turned off. The node N1 and the node N2 are floating, and the levels at the node N2 and the node N1 can be maintained at a low level due to the bootstrapping of the capacitor C01, so that both the second transistor T2 and the fifth transistor T5 are turned on. The second transistor T2 is turned on so that the level at the node N3 is controlled to be a high level, so both the fourth transistor T4 and the sixth transistor T5 are turned off to thereby avoid a signal VGH from affecting the signal of the drive signal output terminal. The fifth transistor T5 is turned on so that the drive signal output terminal Output outputs a drive signal at a low level, and since the drive signal output terminal Output is at a low level, and due to the bootstrapping of the capacitor C01, the level at the node N2 is further pulled down to control the fifth transistor T5 to be turned on so that the drive signal output terminal Output outputs a drive signal at a low level.

Figure 3:
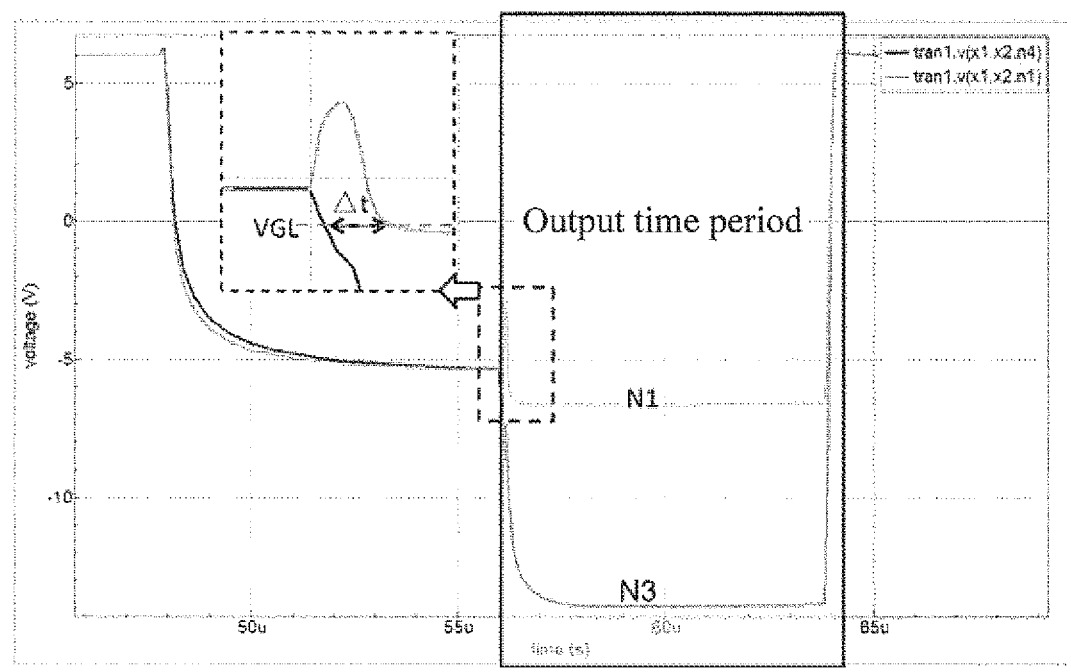
FIG. 3 is a schematic diagram of simulation of a node N1 and a node N2 in the shift register circuit in the related art as illustrated in FIG. 1.

However the operating process of the shift register circuit above in the output time period t2 was simulated, and as illustrated in FIG. 3, the level at the node N1 was jumping in the time period Δt because in a practical application, the jumping clock signal CK had been pulled up from the low level to the high level in a time period Tt, so the first transistor T1 could not be turned off in a timely manner, and thus the level at the node N jumped. Since the level at the node N1 was jumping in the time period Δt, the second transistor T2 could not be controlled in a timely manner to change the level at the node N3 to a high level, so the fourth transistor T4 was turned on in the time period Δt. Since the fifth switch transistor T5 was also turned on in the output time period t2, there was a discharge loop formed by the signal VGH and the clock signal CKB, and thus the capacitor C01 could not be well coupled to control the fifth transistor T5 to be turned on completely, so that the drive signal output terminal Output could not output a scan signal at a low level rapidly, thus prolonging a period of time for pulling down the drive signal output terminal Output, lowering a drive capability, and increasing power consumption. Moreover Δt was positively correlated to Tr, that is, the larger Tr, the larger Δt will be, so the drive signal output terminal Output might have been affected significantly.

In view of this, the embodiments of the disclosure provide a shift register circuit, a method for driving the same, a gate drive circuit and a display panel so as to address the problem in the related art the drive signal output terminal Output could not output a scan signal at a low level rapidly, thus prolonging a period of time for pulling down the drive signal output terminal Output, lowering a drive capability, and increasing power consumption.

In order to make the objects, technical solutions, and advantages of the disclosure more apparent, particular implementations of the shift register circuit, the method for driving the same, the gate drive circuit, and the display panel according to the embodiments of the disclosure will be described below in details with reference to the drawings. It shall be appreciated that preferable embodiments to be described below are only intended to illustrate and explain the disclosure, but not intended to limit the disclosure thereto, and the embodiments of the disclosure and features of the embodiments can be combined with each other unless they conflict with each other.

Figure 4:
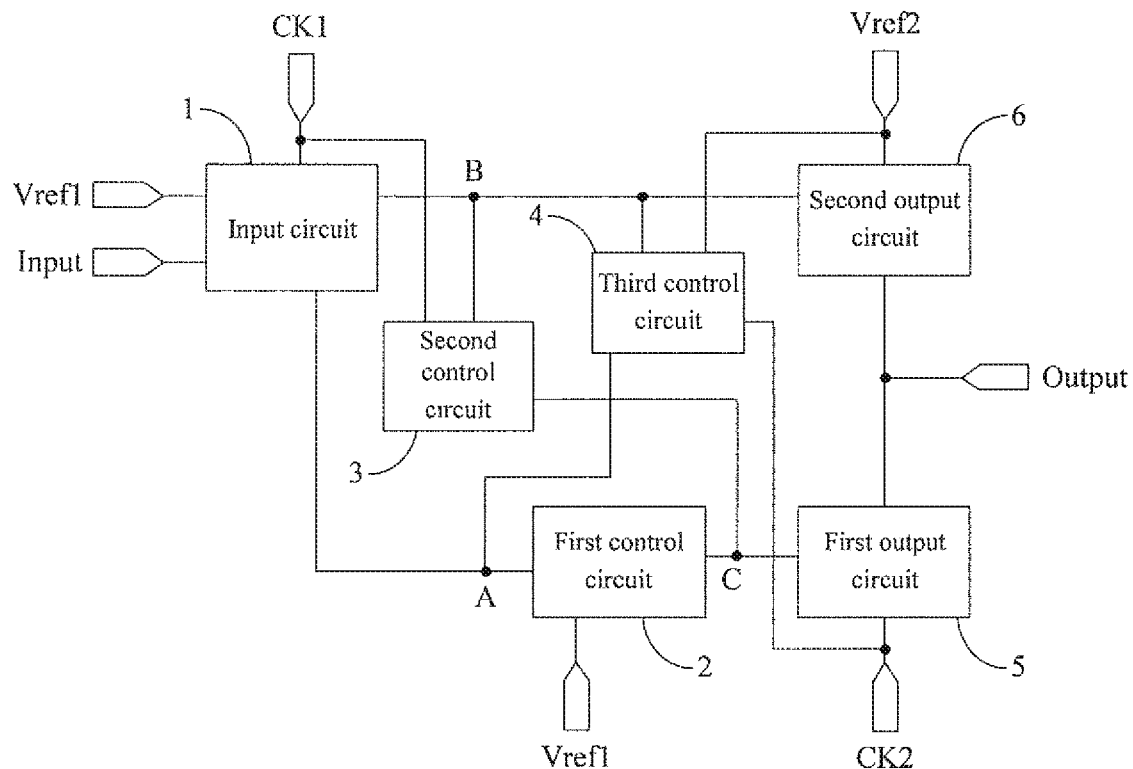
FIG. 4 is a schematic structural diagram of a shift register circuit according to the embodiments of the disclosure.

As illustrated in FIG. 4, a shift register circuit according to the embodiments of the disclosure includes: an input circuit 1, a first control circuit 2, a second control circuit 3, a third control circuit 4, a first output circuit 5, and a second output circuit 6.

Where the input circuit 1 is connected respectively with an input signal terminal Input, a first clock signal terminal CK1, a first reference signal terminal Vref1, a first node A, and a second node B, and configured to provide the first node A with a signal of the input signal terminal Input, and the second node B with a signal of the first reference signal terminal Vref1 respectively under the control of the first clock signal terminal CK1.

The first control circuit 2 is connected respectively with the first reference signal terminal Vref1, the first node A, and a third node C, and configured to connect the first node A with the third node C under the control of the first reference signal terminal Vref1, and to disconnect the first node A from the third node C while the first node A is in a floating state.

The second control circuit 3 is connected respectively with the first clock signal terminal CK1, the second node B, and the third node C, and configured to provide the second node B with a signal of the first clock signal terminal CK1 under the control of a signal of the third node C.

The third control circuit 4 is connected respectively with a second clock signal terminal CK2, a second reference signal terminal Vref2, the first node A, and the second node 9, and configured to provide the first node A with a signal of the second reference signal terminal Vref2 under the control of both signals of the second clock signal terminal CK2 and the second node B.

The first output circuit 5 is connected respectively with the second clock signal terminal CK2, the third node C, and a drive signal output terminal Output, and configured to provide the drive signal output terminal Output with a signal of the second clock signal terminal CK2 under the control of the signal of the third node C, and to maintain a stable difference in voltage between the third node C and the drive signal output terminal Output while the first node A is in the floating state.

And the second output circuit 6 is connected respectively with the second reference signal terminal Vref2, the second node B, and the drive signal output terminal Output, and configured to provide the drive signal output terminal Output with the signal of the second reference signal terminal Vref2 under the control of a signal of the second node B, and to maintain a stable difference in voltage between the second node B and the drive signal output terminal Output while the second node B is in a floating state.

In the shift register circuit above according to the embodiments of the disclosure, the input circuit 1, the first control circuit 2, the second control circuit 3, the third control circuit 4, the first output circuit 5, and the second output circuit 6 cooperate with each other, and since the second control circuit 3 is turned on or off under the control of the signal of the third node C, and the third node C can be pulled down to lower voltage or up to higher voltage rapidly in the output time period, the second control circuit 3 can be controlled rapidly to be turned on, and thus the level at the second node B can be controlled rapidly to be changed to a high or low level to thereby control the second output circuit 6 to be turned off in a timely manner, thus shortening a period of time for pulling down the drive signal output terminal Output, improving a drive capability of the shift register circuit, and lowering power consumption of the shift register circuit.

Particularly in the shift register circuit above according to the embodiments of the disclosure, when the level of a valid pulse signal of the input signal terminal Input is a low level, the level of the signal of the first reference signal terminal Vref1 is a low level, and the level of the signal of the second reference signal terminal Vref2 is a high level. When the level of the valid pulse signal of the input signal terminal Input is a high level, the level of the signal of the first reference signal terminal Vref1 is a high level, and the level of the signal of the second reference signal terminal Vref2 is a low level.

The disclosure will be described below in details in connection with particular embodiments thereof. It shall be noted that these embodiments are intended to better illustrate the disclosure, but not to limit the disclosure thereto.

Figure 5A:
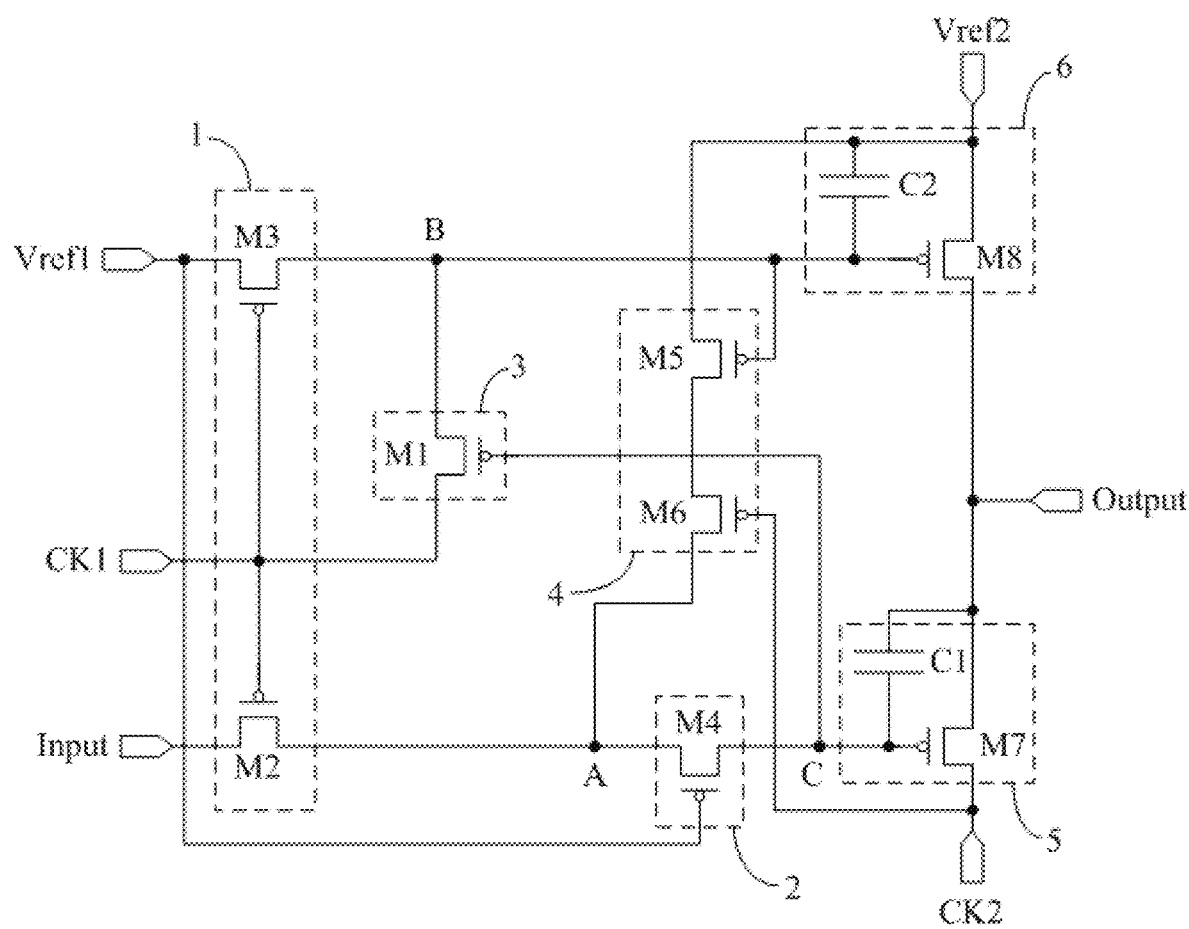
FIG. 5A is another schematic structural diagram of the shift register circuit according to the embodiments of the disclosure.
Figure 5B:
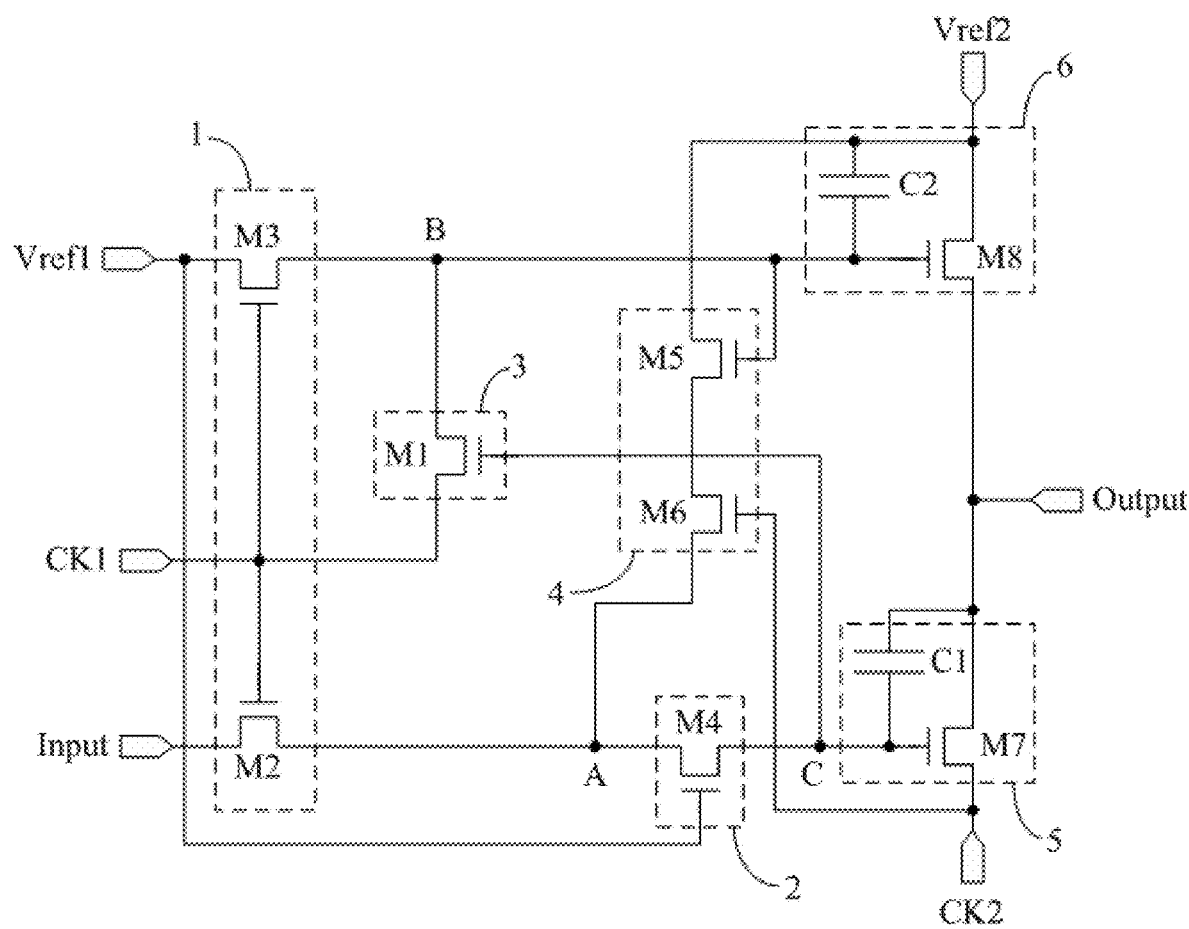
FIG. 5B is yet another schematic structural diagram of the shift register circuit according to the embodiments of the disclosure.

Optionally in the shift register circuit above according to the embodiments of the disclosure, as illustrated in FIG. 5A and FIG. 5B, the second control circuit 3 includes: a first switch transistor M1, where a control electrode of the first switch transistor M1 is connected with the third node C, a first electrode of the first switch transistor M1 is connected with the first clock signal terminal CK1, and a second electrode of the first switch transistor M1 is connected with the second node B.

Particularly in the shift register circuit above according to the embodiments of the disclosure, as illustrated in FIG. 5A, the first switch transistor M1 can be a P-type transistor; or as illustrated in FIG. 5B, the first switch transistor M1 can be an N-type transistor. In a practical application, the particular structure of the first switch transistor M1 can be designed as needed in a practical application environment, although the embodiments of the disclosure will not be limited thereto.

Particularly in the shift register circuit above according to the embodiments of the disclosure, the first switch transistor M1 turned on under the control of the signal of the third node C provides the second node B with the signal of the first clock signal terminal CK1.

Particularly when the first switch transistor M1 is a P-type transistor, since the first switch transistor M1 is turned on or off under the control of the signal of the third node C, and the third node C can be pulled down to lower voltage rapidly in the output time period, the first switch transistor M1 can be controlled rapidly to be turned on, and thus the level at the second node B can be controlled rapidly to be changed to a high level to thereby control the second output circuit 6 to be turned off in a timely manner, thus shortening a period of time for pulling down the drive signal output terminal Output, improving a drive capability of the shift register circuit, and lowering power consumption of the shift register circuit.

Particularly when the first switch transistor M1 is an N-type transistor, since the first switch transistor M1 is turned on or off under the control of the signal of the third node C, and the third node C can be pulled up to higher voltage rapidly in the output time period, the first switch transistor M1 can be controlled rapidly to be turned on, and thus the level at the second node B can be controlled rapidly to be changed to a low level to thereby control the second output circuit 6 to be turned off in a timely manner, thus shortening a period of time for pulling up the drive signal output terminal Output, improving a drive capability of the shift register circuit, and lowering power consumption of the shift register circuit.

Optionally in the shift register circuit above according to the embodiments of the disclosure, as illustrated in FIG. 5A and FIG. 5B, the input circuit 1 includes: a second switch transistor M2 and a third switch transistor M3, where: a control electrode of the second switch transistor M2 is connected with the first clock signal terminal CK1, a first electrode of the second switch transistor M2 is connected with the input signal terminal Input, and a second electrode of the second switch transistor M2 is connected with the first node A; and a control electrode of the third switch transistor M3 is connected with the first clock signal terminal CK1, a first electrode of the third switch transistor M3 is connected with the first reference signal terminal Vref1, and a second electrode of the third switch transistor M3 is connected with the second node B.

Particularly in the shift register circuit above according to the embodiments of the disclosure, as illustrated in FIG. 5A, the second switch transistor M2 and the third switch transistor M3 can be P-type transistors; or as illustrated in FIG. 5B, the second switch transistor M2 and the third switch transistor M3 can be N-type transistors. In a practical application, the particular structures of the second switch transistor M2 and the third switch transistor M3 can be designed as needed in a practical application environment, although the embodiments of the disclosure will not be limited thereto.

Particularly in the shift register circuit above according to the embodiments of the disclosure, the second switch transistor M2 turned on under the control of the signal of the first clock signal terminal CK1 provides the first node A with the signal of the input signal terminal Input. The third switch transistor M3 turned on under the control of the signal of the first clock signal terminal CK1 provides the second node B with the signal of the first reference signal terminal Vref1.

Optionally in the shift register circuit above according to the embodiments of the disclosure, as illustrated in FIG. 5A and FIG. 5B, the first control circuit 2 includes: a fourth switch transistor M4, where: a control electrode of the fourth switch transistor M4 is connected with the first reference signal terminal Vref1, a first electrode of the fourth switch transistor M4 is connected with the third node C, and a second electrode of the fourth switch transistor M4 is connected with the first node A.

Particularly in the shift register circuit above according to the embodiments of the disclosure, as illustrated in FIG. 5A, the fourth switch transistor M4 can be a P-type transistor; or as illustrated in FIG. 5B, the fourth switch transistor M4 can be an N-type transistor. In a practical application, the particular structure of the fourth switch transistor M4 can be designed as needed in a practical application environment, although the embodiments of the disclosure will not be limited thereto.

Particularly in the shift register circuit above according to the embodiments of the disclosure, the fourth switch transistor M4 connects the first node A with the third node C under the control of the first reference signal terminal Vref1, so that the signal of the first node A is transmitted to the third node C. The first node A is disconnected from the third node C while the first node A is in a floating state.

In a practical application, as illustrated in FIG. 5A, when the fourth switch transistor M4 is a P-type transistor, the fourth switch transistor M4 is turned on when a relationship between a difference in voltage between the control electrode thereof and the first electrode thereof, $V_{gs}(M4)$, and threshold voltage thereof $V_{th}(M4)$ satisfies an equation of $V_{gs}(M4)<V_{th}(M4)$. As illustrated in FIG. 5B, when the fourth switch transistor M4 is an N-type transistor, the fourth switch transistor M4 is turned on when the relationship between the difference in voltage between the control electrode thereof and the first electrode thereof, $V_{gs}(M4)$, and the threshold voltage thereof $V_{th}(M4)$ satisfies an equation of $V_{gs}(M4)>V_{th}(M4)$. In this way, a stable level at the third node C can be guaranteed.

Optionally in the shift register circuit above according to the embodiments of the disclosure, as illustrated in FIG. 5A and FIG. 5B, the third control circuit 4 includes: a fifth switch transistor M5 and a sixth switch transistor M6, where: a control electrode of the fifth switch transistor M5 is connected with the second node B, a first electrode of the fifth switch transistor M5 is connected with the second reference signal terminal Vref2, and a second electrode of the fifth switch transistor M5 is connected with a first electrode of the sixth switch transistor M6; and a control electrode of the sixth switch transistor M6 is connected with the second clock signal terminal CK2, and a second electrode of the sixth switch transistor M6 is connected with the first node A.

Particularly in the shift register circuit above according to the embodiments of the disclosure, as illustrated in FIG. 5A, the fifth switch transistor M5 and the sixth switch transistor M6 can be P-type transistors; or as illustrated in FIG. 5B, the fifth switch transistor M5 and the sixth switch transistor M6 can be N-type transistors. In a practical application, the particular structures of the fifth switch transistor M5 and the sixth switch transistor M6 can be designed as needed in a practical application environment, although the embodiments of the disclosure will not be limited thereto.

Particularly in the shift register circuit above according to the embodiments of the disclosure, the fifth switch transistor M5 turned on under the control of the signal of the second node B provides the first electrode of the sixth switch transistor M6 with the signal of the second reference signal terminal Vref2. The switch transistor M turned on under the control of the signal of the second clock signal terminal CK2 provides the first node A with the signal of the first electrode thereof.

Particularly in the shift register circuit above according to the embodiments of the disclosure, as illustrated in FIG. 5A and FIG. 5B, the first output circuit 5 includes: a seventh switch transistor M7 and a first capacitor C1, where: a control electrode of the seventh switch transistor M7 is connected with the third node C, a first electrode of the seventh switch transistor M7 is connected with the second clock signal terminal CK2, and a second electrode of the seventh switch transistor M7 is connected with the drive signal output terminal Output; and a first terminal of the first capacitor C1 is connected with the third node C, and a second terminal of the first capacitor C1 is connected with the drive signal output terminal Output.

Particularly in the shift register circuit above according to the embodiments of the disclosure, as illustrated in FIG. 5A, the seventh switch transistor M7 can be a P-type transistor; or as illustrated in FIG. 5B, the seventh switch transistor M7 can be an N-type transistor. In a practical application, the particular structure of the seventh switch transistor M7 can be designed as needed in a practical application environment, although the embodiments of the disclosure will not be limited thereto.

Particularly in the shift register circuit above according to the embodiments of the disclosure, the seventh switch transistor M7 turned on under the control of the signal of the third node C provides the drive signal output terminal Output with the signal of the second clock signal terminal CK2. While the first node A is in a floating state, the third node C is also floating, and a stable difference in voltage across it, i.e., a stable difference in voltage between the third node C and the drive signal output terminal Output can be maintained due to the bootstrapping of the first capacitor C1.

Optionally in the shift register circuit above according to the embodiments of the disclosure, as illustrated in FIG. 5A and FIG. 5B, the second output circuit 6 includes: an eighth switch transistor M8 and a second capacitor C2, where: a control electrode of the eighth switch transistor M8 is connected with the second node B, a first electrode of the eighth switch transistor M8 is connected with the second reference signal terminal Vref2, and a second electrode of the eighth switch transistor M8 is connected with the drive signal output terminal Output; and a first terminal of the second capacitor C2 is connected with the second node B, and a second terminal of the second capacitor C2 is connected with the second reference signal terminal Vref2.

Particularly in the shift register circuit above according to the embodiments of the disclosure, as illustrated in FIG. 5A, the eighth switch transistor M8 can be a P-type transistor; or as illustrated in FIG. 5B, the eighth switch transistor M8 can be an N-type transistor. In a practical application, the particular structure of the eighth switch transistor M8 can be designed as needed in a practical application environment, although the embodiments of the disclosure will not be limited thereto.

Particularly in the shift register circuit above according to the embodiments of the disclosure, the eighth switch transistor M8 turned on under the control of the signal of the second node B provides the drive signal output terminal Output with the signal of the second reference signal terminal Vref2. While the second node B is in a floating state, a stable difference in voltage across it, i.e., a stable difference in voltage between the second node B and the second reference signal terminal Vref2 can be maintained due to the bootstrapping of the second capacitor C2.

The particular structures of the respective components in the shift register circuit according to the embodiments of the disclosure have been described above only by way of an example, and in a particular implementation, the particular structures of the respective components above will not be limited to the structures above according to the embodiments of the disclosure, but can alternatively be other structures which can occur to those skilled in the art, and the embodiments of the disclosure will not be limited thereto.

Optionally in order to simplify a fabrication process, in the shift register circuit above according to the embodiments of the disclosure, as illustrated in FIG. 5A, all the switch transistors can be P-type transistors; or as illustrated in FIG. 5B, all the switch transistors can be N-type transistors, although the embodiments of the disclosure will not be limited thereto. Particularly a P-type transistor is turned off at a high level, and turned on at a low level, and an N-type transistor is turned off at a low level, and turned on at a high level.

It shall be noted that the respective switch transistors as referred to in the embodiment above of the disclosure can be Thin Film Transistors (TFTs), or can be Metal Oxide Semiconductor Field-Effect Transistors (MOSFETs), although the embodiments of the disclosure will not be limited thereto. In a particular implementation, the control electrodes of the respective switch transistors can be gates thereof, the first electrodes thereof can be sources or drains thereof, and the second electrodes thereof can be the drains or the sources thereof, dependent upon their different types and control signals, although the embodiments of the disclosure will not be limited thereto.

The operating process of the shift register circuit above according to the embodiments of the disclosure will be described below with reference to input-output time sequence diagrams thereof respectively in the structures as illustrated in FIG. 5A and FIG. 5B. In the following description, 1 represents a high-level signal, and 0 represents a low-level signal, where 1 and 0 represent their logic levels, and are only intended to better illustrate the operating process of the shift register circuit above according to the embodiments of the disclosure, but will not refer to any levels applied to the gates of the respective switch transistors in a particular implementation.

Figure 6A:
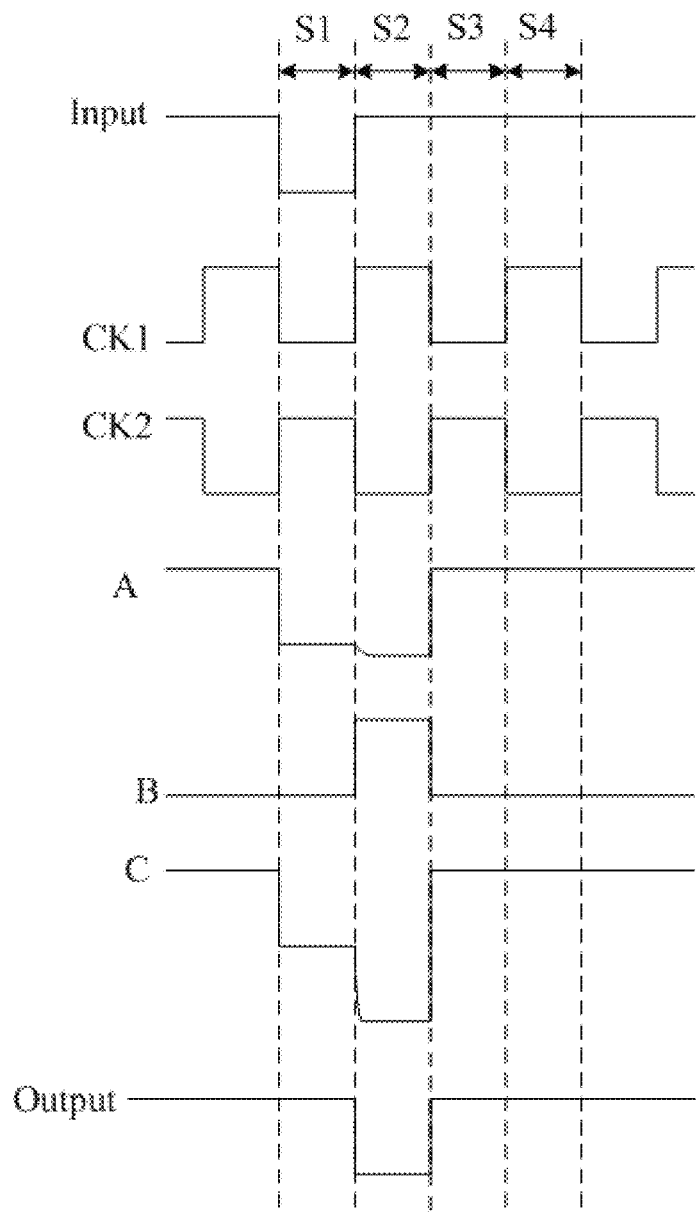
FIG. 6A is an input-output time sequence diagram of the shift register circuit as illustrated in FIG. 5A.

Particularly the operating process of the shift register circuit will be described taking the structure thereof as illustrated in FIG. 5A, where in the shift register circuit as illustrated in FIG. 5A, the level at the first reference signal terminal Vref1 is a low level, and the level at the second reference signal terminal Vref2 is a high level; and FIG. 6A illustrates a corresponding input-output time sequence diagram thereof. Particularly there are four selected stages including a first stage S1, a second stage S2, a third stage S3, and a fourth stage S4 in the input-output time sequence diagram as illustrated in FIG. 6A.

In the first stage S1, Input=0, CK1=0, and CK2=1.

With CK1=0, both the second switch transistor M2 and the third switch transistor M3 are turned on. The turned-on second switch transistor M2 provides the first node A with the low-level signal of the input signal terminal Input, so the voltage at the first node A is at a low level. With Vref1=0, the fourth switch transistor M4 is turned on to provide the third node C with the signal of the first node A so that the level at the third node C is a low level. Since the level at the third node C is a low level, both the first switch transistor M1 and the seventh switch transistor M7 are turned on. The turned-on seventh switch transistor M7 provides the drive signal output terminal Output with the high-level signal of the second clock signal terminal CK2 so that the drive signal output terminal Output outputs a scan signal at a high level, and thus the first capacitor C1 is charged. Since the third switch transistor M3 is turned on, and provides the second node B with the low-level signal of the first reference signal terminal Vref1, the level at the second node B is a low level. Since the first switch transistor M1 is turned on, and provides the second node B with the low-level signal of the first clock signal terminal CK1, the level at the second node B is further pulled down. Since the level at the second node B is a low level, the second capacitor C2 is charged, and the eighth switch transistor M8 is turned on to provide the drive signal output terminal Output with the high-level signal of the second reference signal terminal Vref2, so that the drive signal output terminal Output further outputs a scan signal at a high level.

In the second stage S2, Input=1, CK1=1, and CK2=0.

With CK1=1, both the second switch transistor M2 and the third switch transistor M3 are turned off, and the first node A is in a floating state, so the third node C is also floating. The low level at the third node C can be maintained due to the bootstrapping of the first capacitor C1, so the seventh switch transistor M7 is turned on to provide the drive signal output terminal Output with the low-level signal of the second clock signal terminal CK2, so that the drive signal output terminal Output outputs a scan signal at a low level. Since the level at the drive signal output terminal Output is a low level, due to the bootstrapping of the first capacitor C1, in order to maintain the stable difference in voltage across it, the level at the third node C is further pulled down, so that the seventh switch transistor M7 and the first switch transistor M1 are turned on completely, and the fourth switch transistor M4 is turned off when $V_{gs}(M4) \geq V_{th}(M4)$, so the first node A is controlled to be disconnected from the third node C to thereby avoid leakage current in the second switch transistor M2 from affecting the level at the gate of the seventh switch transistor M7. Since the completely turned-on seventh switch transistor M7 can enable the low-level signal of the second clock signal terminal CK2 to be provided to the drive signal output terminal Output without any voltage loss, so that the drive signal output terminal Output outputs a scan signal at a low level. The completely turned-on first switch transistor M1 can provide the second node B with the high-level signal of the first clock signal terminal CK1 so that the level at the second node B is a high level, so the fifth switch transistor M5 and the eighth switch transistor M8 can be controlled in a timely manner to be turned off rapidly to thereby avoid the drive signal output terminal Output from being affected adversely.

In the third stage S3, Input=1, CK1=0, and CK2=1.

With CK1=0, both the second switch transistor M2 and the third switch transistor M3 are turned on. The turned-on third switch transistor M3 provides the second node B with the low-level signal of the first reference signal terminal Vref1. Since the level at the second node B is a low level, both the fifth switch transistor M5 and the eighth switch transistor M8 are turned on, the second capacitor C2 is charged. The eighth switch transistor M8 is turned on, and provides the drive signal output terminal Output with the high-level signal of the second reference signal terminal Vref2, so that the drive signal output terminal Output outputs a scan signal at a high level. The turned-on second switch transistor M2 provides the first node A with the high-level signal of the input signal terminal Input, so the level at the first node A is a high level. With Vref1=0, the fourth switch transistor M4 is turned on, so that the level at the third node C is a high level, so both the first switch transistor M1 and the seventh switch transistor M7 are controlled to be turned off.

In the fourth stage S4, Input=1, CK1=1, and CK2=0.

With CK1=1 both the second switch transistor M2 and the third switch transistor M3 are turned off, and the second node C is in a floating state. The low level at the second node B can be maintained due to the bootstrapping of the second capacitor C2, so that both the fifth switch transistor M5 and the eighth switch transistor M8 are turned on. The turned-on eighth switch transistor M8 provides the drive signal output terminal Output with the high-level signal of the second reference signal terminal Vref2, so that the drive signal output terminal Output outputs a scan signal at a high level. With CK2=0, the sixth switch transistor M6 is turned on. Since both the fifth switch transistor M5 and the sixth switch transistor M6 are turned on, the first node A can be provided with the high-level signal of the second reference signal terminal Vref2, so the level at the first node A is a high level. With Vref1=0, the level at the third node C is a high level, so that the seventh switch transistor M7 can be controlled to be turned off.

Subsequent to the fourth stage T4, the operating processes in the third stage T3 and the fourth stage F4 are repeated until the level at the input signal terminal Input is changed to a low level again.

Particularly since the first switch transistor M1 is turned on or off under the control of the signal of the third node C, and the third node C can be pulled down to lower voltage rapidly in the second stage T2, the first switch transistor M1 can be controlled rapidly to be turned on, and furthermore the level at the second node B can be controlled rapidly to be changed to a high level to thereby control the eighth switch transistor M8 to be turned off in a timely manner, thus shortening a period of time for pulling down the drive signal output terminal Output, improving a drive capability of the shift register circuit, and lowering power consumption of the shift register circuit.

Figure 7A:
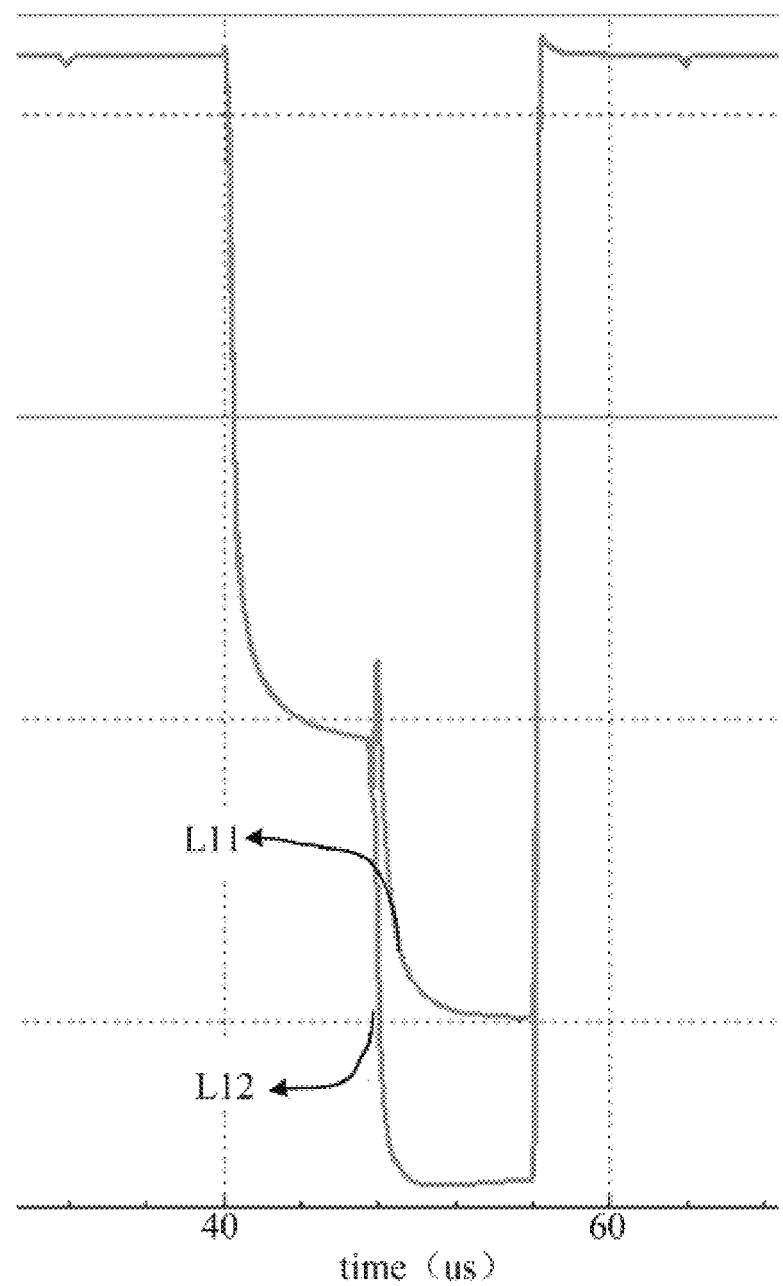
FIG. 7A is a schematic diagram of simulation of the node N2 in the shift register circuit as illustrated in FIG. 1, and a third node in the shift register circuit according to the embodiments of the disclosure as illustrated in FIG. 5A.
Figure 7B:
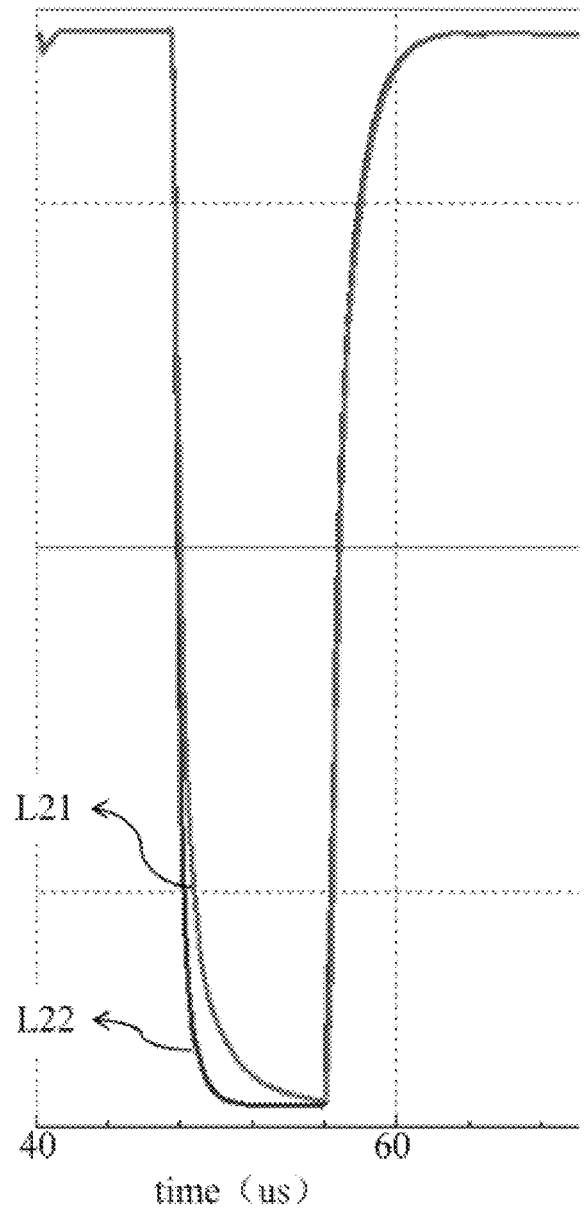
FIG. 7B is a schematic diagram of simulation of a drive signal output terminal in the shift register circuit as illustrated in FIG. 1, and a drive signal output terminal in the shift register circuit according to the embodiments of the disclosure as illustrated in FIG. 5A.

Moreover the varying levels at the node N2 in the shift register circuit in the related art as illustrated in FIG. 1, and the third node C in the shift register circuit above according to the embodiments of the disclosure in the second stage T2 were simulated respectively under the same simulation condition as illustrated in FIG. 7A. Moreover the varying levels at the drive signal output terminal Output in the shift register circuit in the related art as illustrated in FIG. 1, and drive signal output terminal Output in the shift register circuit above according to the embodiments of the disclosure in the second stage T2 were simulated respectively under the same simulation condition as illustrated in FIG. 7B. In FIG. 7A, the ordinate represents voltage (not illustrated in FIG. 7A), and the abscissa represents time; and L11 represents a varying curve of the level at the node N2 in the shift register circuit in the related art in the second stage T2, and L22 represents a varying curve of the level at the third node C in the shift register circuit above according to the embodiments of the disclosure. In FIG. 7B, the ordinate represents voltage (not illustrated in FIG. 7B), and the abscissa represents time; and L21 represents a varying curve of the level at the drive signal output terminal Output in the shift register circuit in the related art in the second stage T2, and L22 represents a varying curve of the level at the drive signal output terminal Output in the shift register circuit above according to he embodiments of the disclosure in the second stage T2. As can be apparent from FIG. 7A, the level at the third node C in the shift register circuit above according to the embodiments of the disclosure can be pulled down more rapidly than the level at the node N2 in the shift register circuit in the related art; and as can be apparent from FIG. 7B, the level at the drive signal output terminal Output in the shift register circuit above according to the embodiments of the disclosure can also be pulled down more rapidly than the level at the drive signal output terminal Output in the shift register circuit in the related art, thus shortening a period of time for pulling down the drive signal output terminal Output, improving a drive capability and lowering power consumption.

Figure 6B:
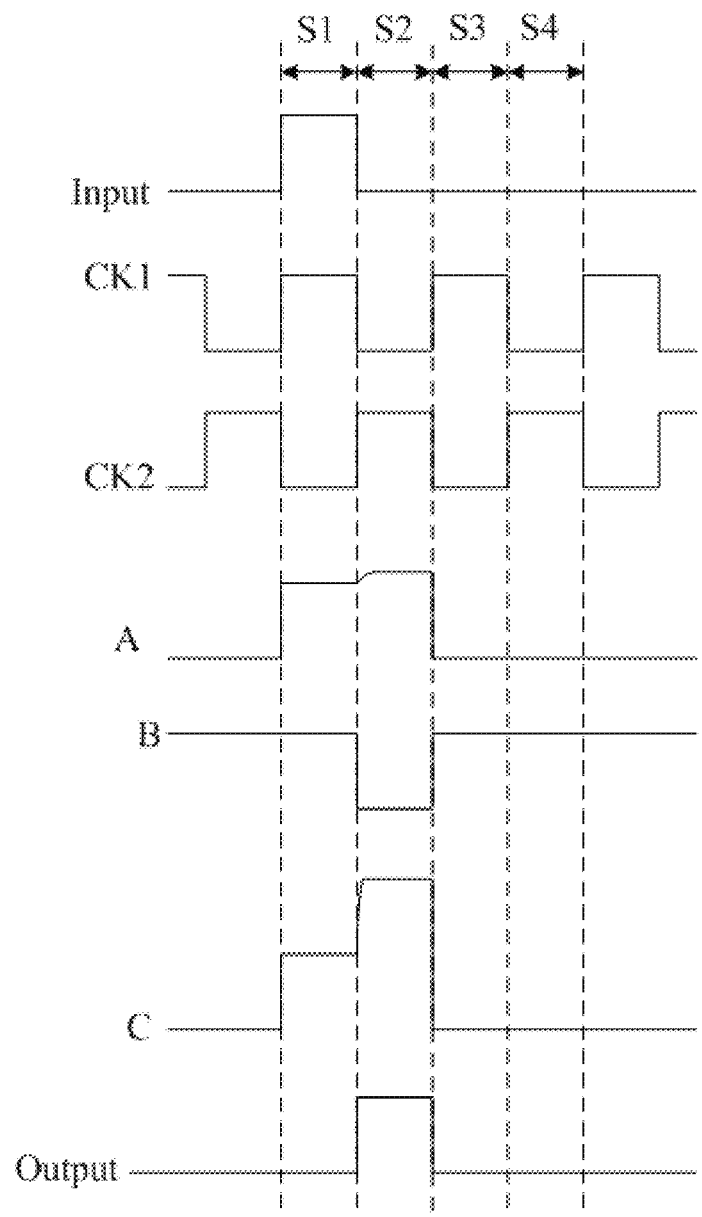
FIG. 6B is an input-output time sequence diagram of the shift register circuit as illustrated in FIG. 5B.

Particularly the operating process of the shift register circuit will be described taking the structure thereof as illustrated in FIG. 5B, where in the shift register circuit as illustrated in FIG. 5B, the level at the first reference signal terminal Vref1 is a high level, and the level at the second reference signal terminal Vref2 is a low level; and FIG. 6B illustrates a corresponding input-output time sequence diagram thereof. Particularly there are four selected stages including a first stage S1, a second stage S2, a third stage S3, and a fourth stage S4 in the input-output time sequence diagram as illustrated in FIG. 6B.

In the first stage S1, Input=1, CK1=1, and CK2=0.

With CK1=1, both the second switch transistor M2 and the third switch transistor M3 are turned on. The turned-on second switch transistor M2 provides the first node A with the high-level signal of the input signal terminal Input, so the voltage at the first node A is at a high level. With Vref1=1, the fourth switch transistor M4 is turned on to provide the third node C with the signal of the first node A, so that the level at the third node C is a high level. Since the level at the third node C is a high level, both the first switch transistor M1 and the seventh switch transistor M7 are turned on. The turned-on seventh switch transistor M7 provides the drive signal output terminal Output with the low-level signal of the second clock signal terminal CK2, so that the drive signal output terminal Output outputs a scan signal at a low level, and thus the first capacitor C1 is charged. Since the third switch transistor M3 is turned on, and provides the second node B with the high-level signal of the first reference signal terminal Vref1, the level at the second node B is a high level, Since the first switch transistor M1 is turned on, and provides the second node B with the high-level signal of the first clock signal terminal CK1, the level at the second node B is further pulled up. Since the level at the second node B is a high level, the second capacitor C2 is charged, and the eighth switch transistor M8 is turned on to provide the drive signal output terminal Output with the low-level signal of the second reference signal terminal Vref2, so that the drive signal output terminal Output further outputs a scan signal at a low level.

In the second stage S2, Input=0, CK1=0, and CK2=1.

With CK1=0, both the second switch transistor M2 and the third switch transistor M3 are turned off, and the first node A is in a floating state, so the third node C is also floating. The high level at the third node C can be maintained due to the bootstrapping of the first capacitor C1, so the seventh switch transistor M7 is turned on to provide the drive signal output terminal Output with the high-level signal of the second clock signal terminal CK2, so that the drive signal output terminal Output outputs a scan signal at a high level. Since the level at the drive signal output terminal Output is a high level, due to the bootstrapping of the first capacitor C1, in order to maintain the stable difference in voltage across it, the level at the third node C is further pulled up, so that the seventh switch transistor M7 and the first switch transistor M1 are turned on completely, and the fourth switch transistor M4 is turned off when $V_{gs}(M4) \leq V_{th}(M4)$, so the first node A is controlled to be disconnected from the third node C to thereby avoid leakage current in the second switch transistor M2 from affecting the level at the gate of the seventh switch transistor M7. Since the completely turned-on seventh switch transistor M7 can enable the high-level signal of the second clock signal terminal CK2 to be provided to the drive signal output terminal Output without any voltage loss, the drive signal output terminal. Output outputs a scan signal at a high level. The completely turned-on first switch transistor M1 can provide the second node B with the low-level signal of the first clock signal terminal CK1 in a timely manner, so that the level at the second node B is a low level, so the fifth switch transistor M5 and the eighth switch transistor M8 can be controlled in a timely manner to be turned off rapidly to thereby avoid the drive signal output terminal Output from being affected adversely.

In the third stage S3, Input=0, CK1=1, and CK2=0.

With CK1=1, both the second switch transistor M2 and the third switch transistor M3 are turned on. The turned-on third switch transistor M3 provides the second node B with the high-level signal of the first reference signal terminal Vref1. Since the level at the second node B is a high level, both the fifth switch transistor M5 and the eighth switch transistor M8 are turned on, and the second capacitor C2 is charged. The eighth switch transistor M8 is turned on, and provides the drive signal output terminal Output with the low-level signal of the second reference signal terminal Vret2, so that the drive signal output terminal Output outputs a scan signal at a low level. The turned-on second switch transistor M2 provides the first node A with the low-level signal of the input signal terminal Input, so the level at the first node A is a low level. With Vref1=1, the fourth switch transistor M4 is turned on, so that the level at the third node C is a low level, so both the first switch transistor M1 and the seventh switch transistor M7 are controlled to be turned off.

In the fourth stage S4, Input=0, CK1=0, and CK2=1.

With CK1=0, both the second switch transistor M2 and the third switch transistor M3 are turned off, and the second node C is in a floating state. The high level at the second node B can be maintained due to the bootstrapping of the second capacitor C2, so that both the fifth switch transistor M5 and the eighth switch transistor M8 are turned on. The turned-on eighth switch transistor M8 provides the drive signal output terminal Output with the low-level signal of the second reference signal terminal Vref2, so that the drive signal output terminal Output outputs a scan signal at a low level. With CK2=1, the sixth switch transistor M6 is turned on. Since both the fifth switch transistor M5 and the sixth switch transistor M6 are turned on, the first node A can be provided with the low-level signal of the second reference signal terminal Vref2, so the level at the first node A is a low level. With Vref1=0, the level at the third node C is a low level, so that the seventh switch transistor M7 can be controlled to be turned off.

Subsequent to the fourth stage T4, the operating processes in the third stage T3 and the fourth stage F4 are repeated until the level at the input signal terminal Input is changed to a high level again.

Particularly since the first switch transistor M1 is turned on or off under the control of the signal of the third node C, and the third node C can be pulled up to higher voltage rapidly in the second stage T2, the first switch transistor M1 can be controlled rapidly to be turned on, and furthermore the level at the second node B can be controlled rapidly to be changed to a low level to thereby control the eighth switch transistor M8 to be turned off in a timely manner, thus shortening a period of time for pulling up the drive signal output terminal Output, improving a drive capability of the shift register circuit, and lowering power consumption of the shift register circuit.

Figure 8:
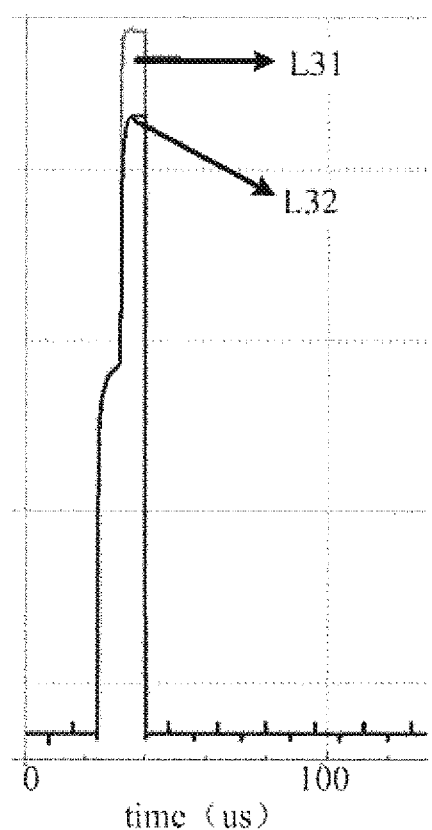
FIG. 8 is a schematic diagram of simulation of a drive signal output terminal in the shift register circuit as illustrated in FIG. 1, where respective transistors are N-type transistors, and a drive signal output terminal in the shift register circuit according to the embodiments of the disclosure as illustrated in FIG. 5B.

Moreover when the respective transistors in the shift register circuit in the related art as illustrated in FIG. 1 are N-type transistors, the varying levels at the drive signal output terminal Output in the shift register circuit in the related art as illustrated in FIG. 1 when the respective transistors in the shift register circuit are N-type transistors, and drive signal output terminal Output in the shift register circuit above according to the embodiments of the disclosure in the second stage T2 were simulated respectively under the same simulation condition as illustrated in FIG. 8. In FIG. 8, the ordinate represents voltage (not illustrated in FIG. 8), and the abscissa represents time; and L31 represents a varying curve of the level at the drive signal output terminal Output in the shift register circuit in the related art in the second stage T2 when the respective transistors in the shift register circuit are N-type transistors, and L32 represents a varying curve of the level at the drive signal output terminal Output in the shift register circuit above according to the embodiments of the disclosure in the second stage T2. As can be apparent from FIG. 8, the level at the drive signal output terminal Output in the shift register circuit above according to the embodiments of the disclosure can also be pulled up more rapidly than the level at the drive signal output terminal Output in the shift register circuit in the related art, thus shortening a period of time for pulling up the drive signal output terminal Output, improving a drive capability and lowering power consumption.

Based upon the same inventive concept, the embodiments of the disclosure further provide a shift register circuit as illustrated in FIG. 5A and FIG. 5B, which includes: a first switch transistor M1, a second switch transistor M2, a third switch transistor M3, a fourth switch transistor M4, a fifth switch transistor M5, a sixth switch transistor M6, a seventh switch transistor M7, a first capacitor C1, an eighth switch transistor M8, and a second capacitor C2.

Where a control electrode of the first switch transistor M1 is connected with a third node C, a first electrode of the first switch transistor M1 is connected with a first clock signal terminal CK1, and a second electrode of the first switch transistor M1 is connected with a second node B.

A control electrode of the second switch transistor M2 is connected with the first clock signal terminal CK1, a first electrode of the second switch transistor M2 is connected with an input signal terminal Input, and a second electrode of the second switch transistor M2 is connected with a first node A.

A control electrode of the third switch transistor M3 is connected with the first clock signal terminal CK1, a first electrode of the third switch transistor M3 is connected with a first reference signal terminal Vref1, and a second electrode of the third switch transistor M3 is connected with the second node B.

A control electrode of the fourth switch transistor M4 is connected with the first reference signal terminal Vref1, a first electrode of the fourth switch transistor M4 is connected with the third node C, and a second electrode of the fourth switch transistor M4 is connected with the first node A.

A control electrode of the fifth switch transistor M5 is connected with the second node B, a first electrode of the fifth switch transistor M5 is connected with a second reference signal terminal Vref2, and a second electrode of the fifth switch transistor M5 is connected with a first electrode of the sixth switch transistor M6.

A control electrode of the sixth switch transistor M6 is connected with a second clock signal terminal CK2, and a second electrode of the sixth switch transistor M6 is connected with the first node A.

A control electrode of the seventh switch transistor M7 is connected with the third node C, a first electrode of the seventh switch transistor M7 is connected with the second clock signal terminal CK2, and a second electrode of the seventh switch transistor M7 is connected with a drive signal output terminal Output.

A first terminal of the first capacitor C1 is connected with the third node C, and a second terminal of the first capacitor C1 is connected with the drive signal output terminal Output.

A control electrode of the eighth switch transistor M8 is connected with the second node B, a first electrode of the eighth switch transistor M8 is connected with the second reference signal terminal Vref2, and a second electrode of the eighth switch transistor M8 is connected with the drive signal output terminal Output.

And a first terminal of the second capacitor C2 is connected with the second node B, and a second terminal of the second capacitor C2 is connected with the second reference signal terminal Vref2.

Based upon the same inventive concept, the embodiments of the disclosure further provide a method for driving the shift register circuit according to the embodiments of the disclosure, and as illustrated in FIG. 9, the method includes a first stage, a second stage, a third stage, and a fourth stage.

S901. In the first stage, the input circuit provides the first node with the signal of the input signal terminal, and the second node with the signal of the first reference signal terminal under the control of the first clock signal terminal respectively; the first control circuit connects the first node with the third node under the control of the first reference signal terminal; the second control circuit provides the second node with the signal of the first clock signal terminal under the control of the signal of the third node; the first output circuit provides the drive signal output terminal with the signal of the second clock signal terminal under the control of the signal of the third node; and the second output circuit provides the drive signal output terminal with the signal of the second reference signal terminal under the control of the signal of the second node.

S902. In the second stage, the first output circuit provides the drive signal output terminal with the signal of the second clock signal terminal under the control of the signal of the third node, and a stable difference in voltage between the third node and the drive signal output terminal is maintained while the first node is in a floating state; the second control circuit provides the second node with the signal of the first clock signal terminal under the control of the signal of the third node; and the first control circuit disconnects the first node from the third node while the first node is in a floating state.

S903. In the third stage, the input circuit provides the first node with the signal of the input signal terminal, and the second node with the signal of the first reference signal terminal respectively under the control of the first clock signal terminal; the first control circuit connects the first node with the third node under the control of the first reference signal terminal; and the second output circuit provides the drive signal output terminal with the signal of the second reference signal terminal under the control of the signal of the second node.

S904. In the fourth stage, the second output circuit provides the drive signal output terminal with the signal of the second reference signal terminal under the control of the signal of the second node, and a stable difference in voltage between the second node and the drive signal output terminal is maintained while the second node is in a floating state; the third control circuit provides the first node with the signal of the second reference signal terminal under the control of both the signals of the second clock signal and the second node; and the first control circuit connects the first node with the third node under the control of the first reference signal terminal.

With the drive method above according to the embodiments of the disclosure, a period of time for pulling down the drive signal output terminal can be shortened, a drive capability can be improved, and power consumption can be lowered.

Figure 10:
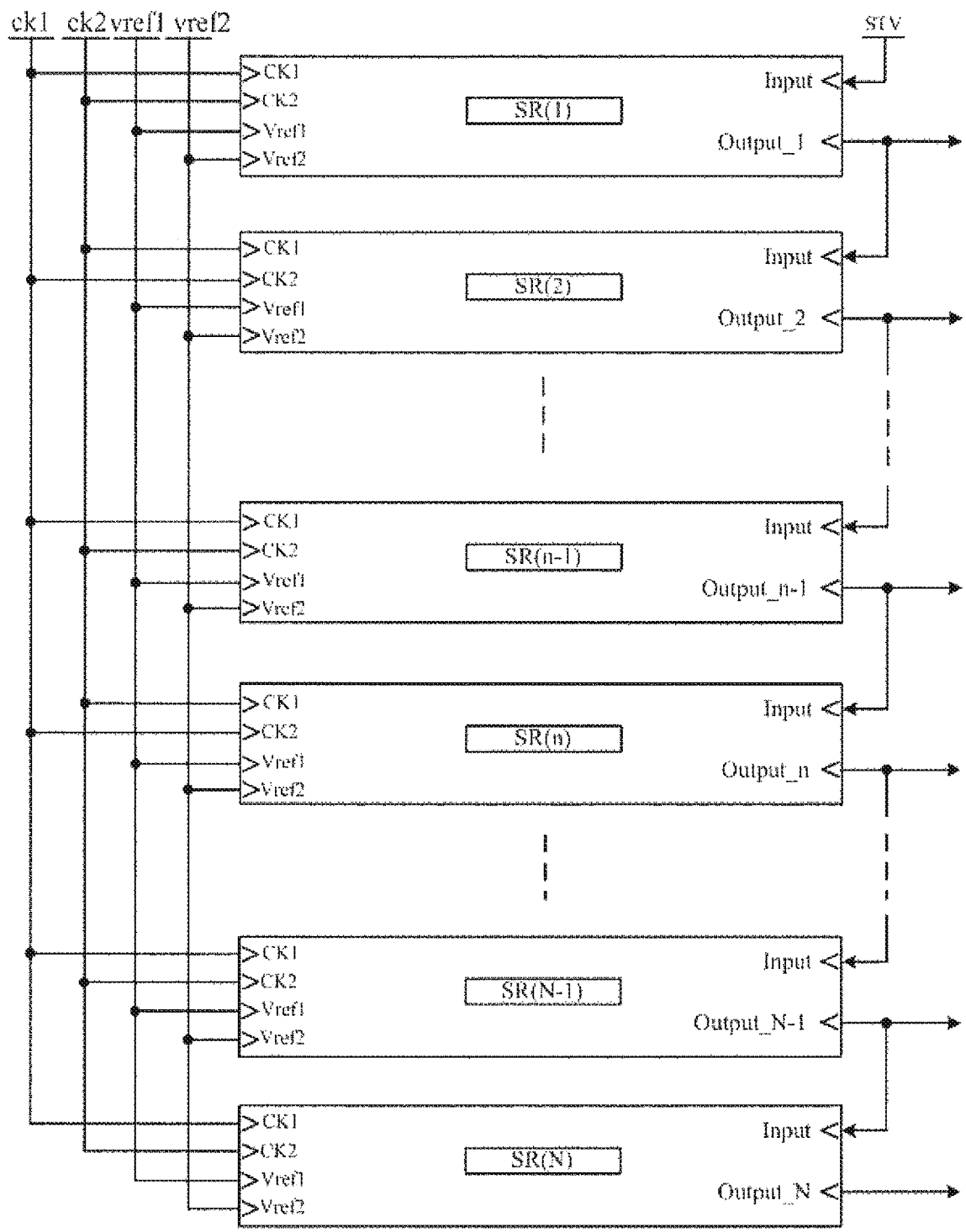
FIG. 10 is a schematic structural diagram of a gate drive circuit according to the embodiments of the disclosure.

Based upon the same inventive concept, the embodiments of the disclosure further provide a gate drive circuit as illustrated in FIG. 10, which includes: a plurality of cascaded shift register circuits according to any one of the embodiments above of the disclosure, SR(1), SR(2), SR(n−1), SR(n), SR(N−1), and SR(N) (N shift register circuits in total, where 1≤n≤N).

Where an input signal terminal Input of a shift register circuit SR(1) in the first level is connected with a frame trigger signal terminal STV; and input signal terminals Input of respective shift register circuit SR(n) in the other levels than the shift register circuit SR(1) in the first level are connected respectively with drive signal output terminals Output of shift register circuits SR(n−1) in the preceding levels connected therewith.

Particularly a particular structure of each shift register circuit in the gate drive circuit above is functionally and structurally identical to the shift register circuit above according to the embodiments of the disclosure, so a repeated description thereof will be omitted here. The gate drive circuit can be applicable to a liquid crystal display panel, and also can be applicable to an organic light-emitting display panel, although the embodiments of the disclosure will not be limited thereto.

Particularly in the gate drive circuit above according to the embodiments of the disclosure, as illustrated in FIG. 10, first reference signal terminals Vref1 of respective shift register circuits SR(n) are connected with the same direct-current signal terminal vref1, and second reference signal terminals Vref2 of the respective shift register circuits SR(n) are connected with the same direct-current signal terminal Vref2.

Particularly in the gate drive circuit above according to the embodiments of the disclosure, as illustrated in FIG. 10, both the first clock signal terminal CK1 of the (2k−1)-th shift register circuit, and the second clock signal terminal CK2 of the 2k–th shift register circuit are connected with the same clock terminal, i.e., a first clock terminal ck1; and both the second clock signal terminal CK2 of the (2k−1)-th shift register circuit, and the first clock signal terminal CK1 of the 2k–th shift register circuit are connected with the same clock terminal, i.e., a second clock terminal ck2, where k is a positive integer.

Based upon the same inventive concept, the embodiments of the disclosure further provide a display panel including the gate drive circuit above according to the embodiments of the disclosure. The display panel addresses the problem under a similar principle to the gate drive circuit above, so reference can be made to the implementations of the gate drive circuit above for an implementation of the display panel, so a repeated description thereof will be omitted here.

In a particular implementation, the display panel above according to the embodiments of the disclosure can be a liquid crystal display panel, or can be an organic light-emitting display panel, although the embodiments of the disclosure will not be limited thereto.

In a particular implementation, the display panel above according to the embodiments of the disclosure can be a mobile phone, a tablet computer, a TV set, a monitor, a notebook computer, a digital photo frame, a navigator, or any other product or component with a display function. All the other indispensable components of the display panel shall readily occur to those ordinarily skilled in the art, so a repeated description thereof will be omitted here, and the disclosure shall not be limited thereto.

In the shift register circuit, the method for driving the same, the gate drive circuit, and the display panel according to the embodiments of the disclosure, the shift register circuit includes: an input circuit, a first control circuit, a second control circuit, a third control circuit, a first output circuit, and a second output circuit, where the input circuit is configured to provide a first node with a signal of an input signal terminal Input, and a second node with a signal of a first reference signal terminal respectively under the control of a first clock signal terminal; the first control circuit is configured to connect the first node with a third node under the control of the first reference signal terminal, and to disconnect the first node from the third node while the first node is in a floating state; the second control circuit is configured to provide the second node with a signal of the first clock signal terminal under the control of a signal of the third node; the third control circuit is configured to provide the first node with a signal of the second reference signal terminal only under the control of both signals of the second clock signal terminal and the second node; the first output circuit is configured to provide a drive signal output terminal with a signal of the second clock signal terminal under the control of a signal of the third node, and to maintain a stable difference in voltage between the third node and the drive signal output terminal while the first node is in a floating state; and the second output circuit is configured to provide the drive signal output terminal with the signal of the second reference signal terminal under the control of a signal of the second node, and to maintain a stable difference in voltage between the second node and the drive signal output terminal while the second node is in a floating state. Accordingly in the shift register circuit above according to the embodiments of the disclosure, the six circuits above can cooperate with each other, thus shortening a period of time for pulling down the drive signal output terminal, improving a drive capability, and lowering power consumption.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A shift register circuit, comprising: an input circuit, a first control circuit, a second control circuit, a third control circuit, a first output circuit, and a second output circuit, wherein:

the input circuit is connected respectively with an input signal terminal, a first clock signal terminal, a first reference signal terminal, a first node, and a second node, and configured to provide the first node with a signal of the input signal terminal, and the second node with a signal of the first reference signal terminal respectively under control of the first clock signal terminal, wherein the first reference signal terminal, the first node and the second node are separate nodes;

the first control circuit is connected respectively with the first reference signal terminal, the first node, and a third node, and configured to connect the first node with the third node under control of the first reference signal terminal, and to disconnect the first node from the third node while the first node is in a floating state;

the second control circuit is connected respectively with the first clock signal terminal, the second node, and the third node, and configured to provide the second node with a signal of the first clock signal terminal under control of a signal of the third node;

the third control circuit is connected respectively with a second clock signal terminal, a second reference signal terminal, the first node, and the second node, and configured to provide the first node with a signal of the second reference signal terminal under control of both signals of the second clock signal terminal and the second node;

the first output circuit is connected respectively with the second clock signal terminal, the third node, and a drive signal output terminal, and configured to provide the drive signal output terminal with a signal of the second clock signal terminal under the control of the signal of the third node, and to maintain a stable difference in voltage between the third node and the drive signal output terminal while the first node is in the floating state; and the second output circuit is connected respectively with the second reference signal terminal, the second node, and the drive signal output terminal, and configured to provide the drive signal output terminal with the signal of the second reference signal terminal under control of a signal of the second node, and to maintain a stable difference in voltage between the second node and the drive signal output terminal while the second node is in a floating state.

2. The shift register circuit according to claim 1, wherein the second control circuit comprises: a first switch transistor, wherein:
- a control electrode of the first switch transistor is connected with the third node, a first electrode of the first switch transistor is connected with the first clock signal terminal, and a second electrode of the first switch transistor is connected with the second node.

3. The shift register circuit according to claim 1, wherein the input circuit comprises: a second switch transistor and a third switch transistor, wherein:
- a control electrode of the second switch transistor is connected with the first clock signal terminal, a first electrode of the second switch transistor is connected with the input signal terminal, and a second electrode of the second switch transistor is connected with the first node; and
- a control electrode of the third switch transistor is connected with the first clock signal terminal, a first electrode of the third switch transistor is connected with the first reference signal terminal, and a second electrode of the third switch transistor is connected with the second node.

4. The shift register circuit according to claim 1, wherein the first control circuit comprises: a fourth switch transistor, wherein:
- a control electrode of the fourth switch transistor is connected with the first reference signal terminal, a first electrode of the fourth switch transistor is connected with the third node, and a second electrode of the fourth switch transistor is connected with the first node.

5. The shift register circuit according to claim 1, wherein the third control circuit comprises: a fifth switch transistor and a sixth switch transistor, wherein:
- a control electrode of the fifth switch transistor is connected with the second node, a first electrode of the fifth switch transistor is connected with the second reference signal terminal, and a second electrode of the fifth switch transistor is connected with a first electrode of the sixth switch transistor; and
- a control electrode of the sixth switch transistor is connected with the second clock signal terminal, and a second electrode of the sixth switch transistor is connected with the first node.

6. The shift register circuit according to claim 1, wherein the first output circuit comprises: a seventh switch transistor and a first capacitor, wherein:
- a control electrode of the seventh switch transistor is connected with the third node, a first electrode of the seventh switch transistor is connected with the second clock signal terminal, and a second electrode of the seventh switch transistor is connected with the drive signal output terminal; and
- a first terminal of the first capacitor is connected with the third node, and a second terminal of the first capacitor is connected with the drive signal output terminal.

7. The shift register circuit according to claim 1, wherein the second output circuit comprises: an eighth switch transistor and a second capacitor, wherein:
- a control electrode of the eighth switch transistor is connected with the second node, a first electrode of the eighth switch transistor is connected with the second reference signal terminal, and a second electrode of the eighth switch transistor is connected with the drive signal output terminal; and
- a first terminal of the second capacitor is connected with the second node, and a second terminal of the second capacitor is connected with the second reference signal terminal.

8. A gate drive circuit, comprising a plurality of cascaded shift register circuits, wherein:
- an input signal terminal of a shift register circuit in a first level is connected with a frame trigger signal terminal; and
- input signal terminals of respective shift register circuits in other levels than the shift register circuit in the first level are connected respectively with drive signal output terminals of shift register circuits in preceding levels connected therewith;
- wherein each shift register circuit comprises: an input circuit, a first control circuit, a second control circuit, a third control circuit, a first output circuit, and a second output circuit, wherein:
  the input circuit is connected respectively with an input signal terminal, a first clock signal terminal, a first reference signal terminal, a first node, and a second node, and configured to provide the first node with a signal of the input signal terminal, and the second node with a signal of the first reference signal terminal respectively under control of the first clock signal terminal, wherein the first reference signal terminal, the first node and the second node are separate nodes;
  the first control circuit is connected respectively with the first reference signal terminal, the first node, and a third node, and configured to connect the first node with the third node under control of the first reference signal terminal, and to disconnect the first node from the third node while the first node is in a floating state;
  the second control circuit is connected respectively with the first clock signal terminal, the second node, and the third node, and configured to provide the second node with a signal of the first clock signal terminal under control of a signal of the third node;
  the third control circuit is connected respectively with a second clock signal terminal, a second reference signal terminal, the first node, and the second node, and configured to provide the first node with a signal of the second reference signal terminal under control of both signals of the second clock signal terminal and the second node;
  the first output circuit is connected respectively with the second clock signal terminal, the third node, and a drive signal output terminal, and configured to provide the drive signal output terminal with a signal of the second clock signal terminal under the control of the signal of the third node, and to maintain a stable difference in voltage between the third node and the drive signal output terminal while the first node is in the floating state; and
  the second output circuit is connected respectively with the second reference signal terminal, the second node, and the drive signal output terminal, and configured to provide the drive signal output terminal with the signal of the second reference signal terminal under control of a signal of the second node, and to maintain a stable difference in voltage between the second node and the drive signal output terminal while the second node is in a floating state.

9. A display panel, comprising the gate drive circuit according to claim 8.

10. A method for driving the shift register circuit according to claim 1, the method comprising: a first stage, a second stage, a third stage, and a fourth stage, wherein:
- in the first stage, the input circuit provides the first node with the signal of the input signal terminal, and the second node with the signal of the first reference signal terminal under the control of the first clock signal terminal respectively; the first control circuit connects the first node with the third node under the control of the first reference signal terminal; the second control circuit provides the second node with the signal of the first clock signal terminal under the control of the signal of the third node; the first output circuit provides the drive signal output terminal with the signal of the second clock signal terminal under the control of the signal of the third node; and the second output circuit provides the drive signal output terminal with the signal of the second reference signal terminal under the control of the signal of the second node;
- in the second stage, the first output circuit provides the drive signal output terminal with the signal of the second clock signal terminal under the control of the signal of the third node, and a stable difference in voltage between the third node and the drive signal output terminal is maintained while the first node is in the floating state; the second control circuit provides the second node with the signal of the first clock signal terminal under the control of the signal of the third node; and the first control circuit disconnects the first node from the third node while the first node is in the floating state;
- in the third stage, the input circuit provides the first node with the signal of the input signal terminal, and the second node with the signal of the first reference signal terminal respectively under the control of the first clock signal terminal; the first control circuit connects the first node with the third node under the control of the first reference signal terminal; and the second output circuit provides the drive signal output terminal with the signal of the second reference signal terminal under the control of the signal of the second node; and
- in the fourth stage, the second output circuit provides the drive signal output terminal with the signal of the second reference signal terminal under the control of the signal of the second node, and a stable difference in voltage between the second node and the drive signal output terminal is maintained while the second node is in the floating state; the third control circuit provides the first node with the signal of the second reference signal terminal under the control of both the signals of the second clock signal and the second node; and the first control circuit connects the first node with the third node under the control of the first reference signal terminal.

11. A shift register circuit, comprising: a first switch transistor, a second switch transistor, a third switch transistor, a fourth switch transistor, a fifth switch transistor, a sixth switch transistor, a seventh switch transistor, a first capacitor, an eighth switch transistor, and a second capacitor, wherein:
- a control electrode of the first switch transistor is connected with a third node, a first electrode of the first switch transistor is connected with a first clock signal terminal, and a second electrode of the first switch transistor is connected with a second node;
- a control electrode of the second switch transistor is connected with the first clock signal terminal, a first electrode of the second switch transistor is connected with an input signal terminal, and a second electrode of the second switch transistor is connected with a first node;
- a control electrode of the third switch transistor is connected with the first clock signal terminal, a first electrode of the third switch transistor is connected with a first reference signal terminal, and a second electrode of the third switch transistor is connected with the second node;
- a control electrode of the fourth switch transistor is connected with the first reference signal terminal, a first electrode of the fourth switch transistor is connected with the third node, and a second electrode of the fourth switch transistor is connected with the first node;
- a control electrode of the fifth switch transistor is connected with the second node, a first electrode of the fifth switch transistor is connected with a second reference signal terminal, and a second electrode of the fifth switch transistor is connected with a first electrode of the sixth switch transistor;
- a control electrode of the sixth switch transistor is connected with a second clock signal terminal, and a second electrode of the sixth switch transistor is connected with the first node;
- a control electrode of the seventh switch transistor is connected with the third node, a first electrode of the seventh switch transistor is connected with the second clock signal terminal, and a second electrode of the seventh switch transistor is connected with a drive signal output terminal;
- a first terminal of the first capacitor is connected with the third node, and a second terminal of the first capacitor is connected with the drive signal output terminal;
- a control electrode of the eighth switch transistor is connected with the second node, a first electrode of the eighth switch transistor is connected with the second reference signal terminal, and a second electrode of the eighth switch transistor is connected with the drive signal output terminal; and
- a first terminal of the second capacitor is connected with the second node, and a second terminal of the second capacitor is connected with the second reference signal terminal.

12. The gate drive circuit according to claim 8, wherein the second control circuit comprises: a first switch transistor, wherein:
- a control electrode of the first switch transistor is connected with the third node, a first electrode of the first switch transistor is connected with the first clock signal terminal, and a second electrode of the first switch transistor is connected with the second node.

13. The gate drive circuit according to claim 8, wherein the input circuit comprises: a second switch transistor and a third switch transistor, wherein:
- a control electrode of the second switch transistor is connected with the first clock signal terminal, a first electrode of the second switch transistor is connected with the input signal terminal, and a second electrode of the second switch transistor is connected with the first node; and
- a control electrode of the third switch transistor is connected with the first clock signal terminal, a first electrode of the third switch transistor is connected with the first reference signal terminal, and a second electrode of the third switch transistor is connected with the second node.

14. The gate drive circuit according to claim 8, wherein the first control circuit comprises: a fourth switch transistor, wherein:
- a control electrode of the fourth switch transistor is connected with the first reference signal terminal, a first electrode of the fourth switch transistor is connected with the third node, and a second electrode of the fourth switch transistor is connected with the first node.

15. The gate drive circuit according to claim 8, wherein the third control circuit comprises: a fifth switch transistor and a sixth switch transistor, wherein:
- a control electrode of the fifth switch transistor is connected with the second node, a first electrode of the fifth switch transistor is connected with the second reference signal terminal, and a second electrode of the fifth switch transistor is connected with a first electrode of the sixth switch transistor; and
- a control electrode of the sixth switch transistor is connected with the second clock signal terminal, and a second electrode of the sixth switch transistor is connected with the first node.

16. The gate drive circuit according to claim 8, wherein the first output circuit comprises: a seventh switch transistor and a first capacitor, wherein:
- a control electrode of the seventh switch transistor is connected with the third node, a first electrode of the seventh switch transistor is connected with the second clock signal terminal, and a second electrode of the seventh switch transistor is connected with the drive signal output terminal; and
- a first terminal of the first capacitor is connected with the third node, and a second terminal of the first capacitor is connected with the drive signal output terminal.

17. The gate drive circuit according to claim 8, wherein the second output circuit comprises: an eighth switch transistor and a second capacitor, wherein:
- a control electrode of the eighth switch transistor is connected with the second node, a first electrode of the eighth switch transistor is connected with the second reference signal terminal, and a second electrode of the eighth switch transistor is connected with the drive signal output terminal; and
- a first terminal of the second capacitor is connected with the second node, and a second terminal of the second capacitor is connected with the second reference signal terminal.

\* \* \* \* \*